United States Patent
Miyamoto et al.

(10) Patent No.: US 12,360,180 B2
(45) Date of Patent: Jul. 15, 2025

(54) MAGNETIC FIELD SENSOR HEAD AND METHOD FOR MANUFACTURING SAME

(71) Applicants: CITIZEN FINEDEVICE CO., LTD., Yamanashi (JP); CITIZEN WATCH CO., LTD., Tokyo (JP)

(72) Inventors: Mitsunori Miyamoto, Nagano (JP); Toshiya Kubo, Nagano (JP)

(73) Assignees: CITIZEN FINEDEVICE CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 146 days.

(21) Appl. No.: 18/037,203

(22) PCT Filed: Sep. 10, 2021

(86) PCT No.: PCT/JP2021/033409
§ 371 (c)(1),
(2) Date: May 16, 2023

(87) PCT Pub. No.: WO2022/107431
PCT Pub. Date: May 27, 2022

(65) Prior Publication Data
US 2024/0003994 A1 Jan. 4, 2024

(30) Foreign Application Priority Data
Nov. 19, 2020 (JP) ................. 2020-192695

(51) Int. Cl.
*G01R 33/032* (2006.01)
*G01R 33/00* (2006.01)

(52) U.S. Cl.
CPC ..... *G01R 33/0322* (2013.01); *G01R 33/0052* (2013.01)

(58) Field of Classification Search
CPC . G01R 33/0322; G01R 33/0052; G02B 6/024
USPC ......................................... 324/260
See application file for complete search history.

(56) References Cited

U.S. PATENT DOCUMENTS

| | | | |
|---|---|---|---|
| 4,947,035 A | 8/1990 | Zook et al. | |
| 5,699,461 A * | 12/1997 | Minemoto | G01R 15/245 374/E11.015 |
| 6,289,156 B1 | 9/2001 | Pan et al. | |

(Continued)

FOREIGN PATENT DOCUMENTS

| | | |
|---|---|---|
| JP | 2002-528707 A | 9/2002 |
| JP | 2006-276737 A | 10/2006 |

(Continued)

OTHER PUBLICATIONS

EPO, Extended European Search Report for European Patent Application No. 21894306.6, Sep. 18, 2024.

(Continued)

*Primary Examiner* — Christopher P McAndrew

(57) ABSTRACT

A magnetic field sensor head includes an optical fiber, a GI fiber whose one end is optically connected to the optical fiber, a magnetic film joined to the other end of the GI fiber, a reflection film joined to a surface of the magnetic film opposite to a surface joined to the magnetic film, and a support member joined to a surface of the reflection film opposite to the surface joined to the magnetic film.

10 Claims, 7 Drawing Sheets

(56) References Cited

U.S. PATENT DOCUMENTS

| | | | | |
|---|---|---|---|---|
| 6,437,885 B1* | 8/2002 | Duncan | ............... | G02B 6/4214 |
| | | | | 359/283 |
| 6,976,792 B1* | 12/2005 | Cohen | ................... | G02B 6/136 |
| | | | | 385/129 |
| 9,194,991 B2* | 11/2015 | Chiang | ................ | G02B 6/3636 |
| 11,435,415 B2* | 9/2022 | Kubo | .................... | G01R 15/24 |
| 2003/0146748 A1* | 8/2003 | Duncan | ............. | G01R 33/0322 |
| | | | | 324/244.1 |
| 2006/0056792 A1* | 3/2006 | Ellwood | ................ | G02F 1/095 |
| | | | | 385/147 |
| 2009/0231665 A1 | 9/2009 | Takei et al. | | |
| 2010/0079855 A1* | 4/2010 | Dong | ................. | H01S 3/06754 |
| | | | | 359/341.3 |
| 2015/0323734 A1* | 11/2015 | Kato | ..................... | G02B 6/126 |
| | | | | 349/193 |
| 2022/0146600 A1 | 5/2022 | Miyamoto et al. | | |

FOREIGN PATENT DOCUMENTS

| | | |
|---|---|---|
| JP | 2020-126006 A | 8/2020 |
| WO | 00/23811 A1 | 4/2000 |
| WO | 2006/090846 A1 | 8/2006 |

OTHER PUBLICATIONS

WIPO, International Search Report for International Application No. PCT/JP2021/033409, Nov. 30, 2021.

WIPO, International Preliminary Report on Patentability including Written Opinion for International Application No. PCT/JP2021/033409, Nov. 30, 2021 English translation of Written Opinion is attached hereto).

\* cited by examiner

MAGNETIC FIELD SENSOR HEAD AND METHOD FOR MANUFACTURING SAME

FIELD

The present disclosure relates to a magnetic field sensor head and a manufacturing method thereof.

BACKGROUND

A polarization maintaining fiber (PMF) is known which improves maintenance of polarization of propagated light by applying nonaxially symmetric stress to the core thereof. A PANDA (polarization-maintaining and absorption-reducing) fiber, bowtie fiber, elliptical jacket fiber, etc. are known as polarization maintaining fibers.

Further, a magnetic field sensor head using a polarization maintaining fiber is known. For example, a magnetic field sensor head is described in Japanese Unexamined Patent Publication No. 2020-126006 in which a second polarization maintaining fiber with a fast axis and a slow axis inclined by 45 degrees with respect to the fast axis and slow axis of a first polarization maintaining fiber is arranged between a polarization maintaining fiber and a Faraday rotator comprised of a granular film. In the magnetic field sensor head described in Japanese Unexamined Patent Publication No. 2020-126006, the second polarization maintaining fiber functions as a polarization conversion element for converting linearly polarized light introduced to the polarization maintaining fiber to circularly polarized light and may transmit light sent and received to and from the Faraday rotator without using a ¼ wavelength plate.

In the magnetic field sensor head described in Japanese Unexamined Patent Publication No. 2020-126006, although light sent to and received from the Faraday rotator may be transmitted without using a ¼ wavelength plate, the detection sensitivity of the magnetic field sensor head is desirably further improved. A magnetic field sensor head is described in Japanese Unexamined Patent Publication No. 2002-528707 in which a GRIN lens is arranged between an optical fiber and magnetic film. The magnetic field sensor head described in Japanese Unexamined Patent Publication No. 2002-528707 may enlarge the region of the magnetic film upon which light is incident to over the core diameter to thereby improve the detection sensitivity, by arranging the GRIN lens between the optical fiber and magnetic film.

SUMMARY

However, the magnetic field sensor head described in Japanese Unexamined Patent Publication No. 2002-528707 has the GRIN lens arranged between the optical fiber and the Faraday rotator, and therefore optical alignment between the optical fiber and GRIN lens becomes troublesome and manufacturing is not easy.

An object of the present disclosure is to provide a magnetic field sensor head which may easily manufacture and have high detection sensitivity.

A magnetic field sensor head according to the present disclosure includes an optical fiber, a GI fiber whose one end is optically connected to the optical fiber, a magnetic film joined to the other end of the GI fiber, a reflection film joined to a surface of the magnetic film opposite to a surface joined to the magnetic film, and a support member joined to a surface of the reflection film opposite to the surface joined to the magnetic film.

Further, it is preferable for the magnetic field sensor head according to the present disclosure that the cladding diameter of the GI fiber is the same as the cladding diameter of the optical fiber.

Further, it is preferable for the magnetic field sensor head according to the present disclosure that the magnetic film, reflection film and support member form a square columnar rod-shaped member having square-shaped bottom surfaces, one of the bottom surfaces is the surface of the magnetic film joined to the GI fiber, and the other of the bottom surfaces is a surface opposite to the surface of the support member joined to the reflection film.

Further, it is preferable for the magnetic field sensor head according to the present disclosure that the magnetic film is a rare earth iron garnet.

Further, it is preferable for the magnetic field sensor head according to the present disclosure that the length of the diagonal of the surface of the magnetic film is equal to or less than the cladding diameter of the GI fiber.

Further, it is preferable for the magnetic field sensor head according to the present disclosure that the beam diameter of light introduced from the GI fiber to the reflection film is equal to or more than 20 μm, and is equal to or less than the length of one side of the reflection film.

Further, a manufacturing method of a magnetic field sensor head includes melt bonding one end of an optical fiber to one end of a GI fiber; and adhering a square-shaped bottom surface of a square columnar rod-shaped member having a support member on which a reflection film and magnetic film are formed, by adherence to the other end of the GI fiber, wherein the length of one side of the bottom surface of the magnetic film is equal to or more than 20 μm, and is equal to or less than the cladding diameter of the GI fiber.

Further, it is preferable for the manufacturing method according to the present disclosure that the length of one side of the surface of the magnetic film is equal to or less than the cladding diameter of the GI fiber.

Further, it is preferable for the manufacturing method according to the present disclosure to include forming a reflection layer on a base member, forming a magnetic layer on the magnetic reflection layer, forming the rod-shaped member with one end of the rod-shaped member bonded to the base member by half dicing the base member on which the reflection layer and magnetic layer are formed so that the magnetic layer has a square-shape, and cutting the rod-shaped member from the base member.

In the present disclosure, a magnetic field sensor head having high detection sensitivity may easily manufacture.

BRIEF DESCRIPTION OF THE DRAWINGS

FIG. 5 is a view showing a manufacturing method of the rod-shaped member formed by the magnetic film, reflection film, and support member.

FIG. 6 is a view showing a manufacturing method of the magnetic field sensor head shown in FIG. 1, wherein

DESCRIPTION OF EMBODIMENTS

Figure 1:
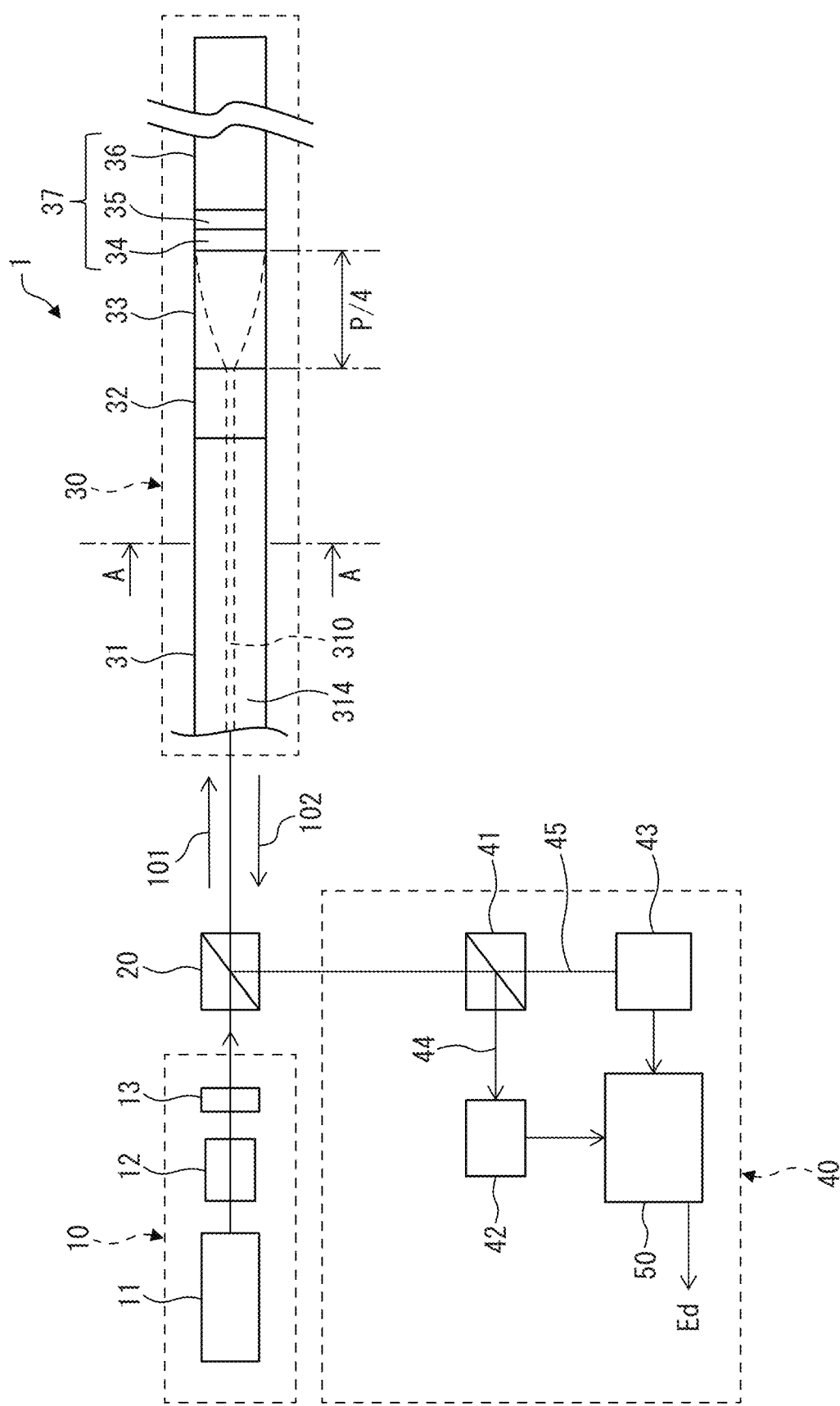
FIG. 1 is a block diagram showing a magnetic field sensor device having a magnetic field sensor head according to an embodiment.

Below, referring to the drawings, a magnetic field sensor head and manufacturing method thereof according to the present disclosure will be explained. However, it should be noted that the technical scope of the present invention is not limited to the embodiments of these and extends to the inventions described in the claims and their equivalents.

(Configuration and Function of Magnetic Field Sensor Head According to Embodiment)

FIG. 1 is a block diagram showing a magnetic field sensor device having a magnetic field sensor head according to an embodiment.

The magnetic field sensor device 1 has a light emitter 10, light splitter 20, magnetic field sensor head 30 and detection signal generator 40. The light emitter 10 has a light emitting element 11, isolator 12 and polarizer 13.

The light emitting element 11 is, for example, a semiconductor laser or light emitting diode. Specifically, a Fabry-Perot laser, super luminescence diode, etc. may be preferably used as the light emitting element 11.

The isolator 12 passes light incident from the light emitting element 11 to the light splitter 20 side and does not pass light incident from the light splitter 20 to the light emitting element 11 side so as to protect the light emitting element 11. The isolator 12 is, for example, a polarization dependent type light isolator, and may also be a nonpolarization dependent type light isolator.

The polarizer 13 is an optical element for polarizing the light which the light emitting element 11 emits to linearly polarized light. The type is not particularly limited. The linearly polarized light obtained by the polarizer 13 is output through the light splitter 20 to the magnetic field sensor head 30 as incident light 101.

The light splitter 20 passes light emitted from the light emitter 10 to the magnetic field sensor head 30 and splits return light 102 emitted from the magnetic field sensor head 30 to the detection signal generator 40. The directions of passage and splitting may also be reversed. The light splitter 20 is, for example, a half mirror, and may also be an optical coupler coupling and splitting an optical fiber, a beam splitter splitting the light, an optical circulator, or other optical element able to split light.

The magnetic field sensor head 30 has a first polarization maintaining fiber 31, second polarization maintaining fiber 32, GI fiber 33, magnetic film 34, reflection film 35 and support member 36. At least a portion of these may be arranged inside a predetermined magnetic field. The magnetic film 34, reflection film 35 and support member 36 form a rod-shaped member 37. The magnetic field sensor head 30 receives linearly polarized light which the light emitter 10 emitted as incident light 101 and outputs return light 102 corresponding to the incident light 101 which was introduced.

The detection signal generator 40 has a polarization separation element 41, first light receiving element 42, second light receiving element 43 and signal processor 50 and receives return light 102 output from the first polarization maintaining fiber 31. The polarization separation element 41 is a prism type, flat surface type, wedge board type, lightguide type, or other polarization beam splitter (PBS) and separates the return light 102 output from the first polarization maintaining fiber 31 into an S-polarized light component 44 and P-polarized light component 45.

The first light receiving element 42 and the second light receiving element 43 are respectively, for example, PIN photo diodes. The first light receiving element 42 receives the S-polarized light component 44, while the second light receiving element 43 receives the P-polarized light component 45. The first light receiving element 42 and the second light receiving element 43 respectively convert the received light photoelectrically and output electrical signals corresponding to the amounts of light received.

Figure 2:
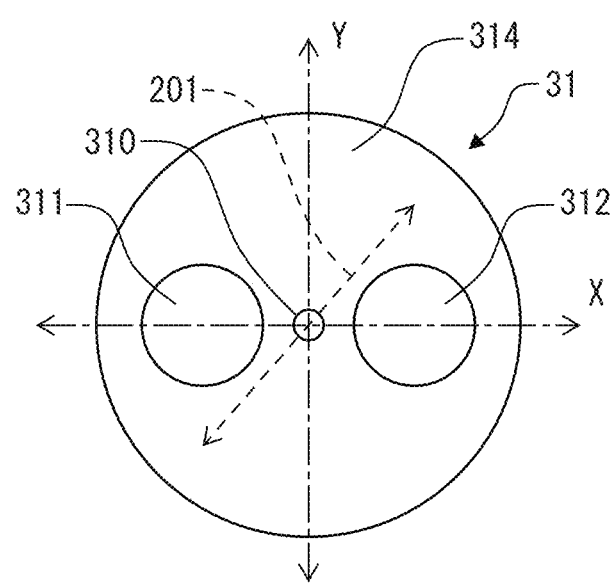
FIG. 2 is a cross-sectional view of the first polarization maintaining fiber along the line A-A shown in FIG. 1.

FIG. 2 is a cross-sectional view of the first polarization maintaining fiber 31 along the line A-A shown in FIG. 1.

The first polarization maintaining fiber 31 is a PANDA fiber and has a core 310, a pair of stress imparters 311 and 312 and a cladding 314. The core diameter of the first polarization maintaining fiber 31 is about 10 µm, while the cladding diameter is 125 µm. The core 310 is, for example, formed by silicon dioxide to which germanium dioxide ($GeO_2$) is added so that its refractive index becomes larger than the cladding 314 formed by silicon oxide ($SiO_2$). The pair of stress imparters 311 and 312 are respectively formed by for example silicon dioxide to which boron oxide ($B_2O_3$) is added. In the cooling step of spinning of the first polarization maintaining fiber 31, they contract much greater than the cladding 314 and impart tensile stress in the X-axis direction.

The first polarization maintaining fiber 31 is arranged so that the plane of polarization 201 of the incident light 101 which is introduced from the light emitter 10 through the light splitter 20 is inclined 45 degrees with respect to the slow axis of the X-axis and the fast axis of the Y-axis. The first polarization maintaining fiber 31 propagates the incident light 101 which is introduced split into a first linearly polarized wave propagated along the X-axis and a second linearly polarized wave propagated along the Y-axis, by being arranged with the X-axis and Y-axis being inclined 45 degrees with respect to the plane of polarization 201 of the incident light 101 which is introduced. The amplitude of the first linearly polarized wave introduced to the X-axis is equal to the amplitude of the second linearly polarized wave introduced to the Y-axis.

Although the first polarization maintaining fiber 31 is a PANDA fiber, the first polarization maintaining fiber 31 may also be a bowtie fiber and elliptical jacket fiber or other polarization maintaining fiber.

The second polarization maintaining fiber 32, like the first polarization maintaining fiber 31, is a PANDA fiber. The configuration of the second polarization maintaining fiber 32 is similar to the configuration of the first polarization maintaining fiber 31, so a detailed explanation will be omitted. The core diameter and the cladding diameter of the second polarization maintaining fiber 32 are the same as the core diameter and the cladding diameter of the first polarization maintaining fiber 31.

The second polarization maintaining fiber 32 is optically connected to the first polarization maintaining fiber 31 with a second slow axis and a second fast axis inclined 45 degrees with respect to the slow axis and fast axis of the first polarization maintaining fiber 31. The second polarization maintaining fiber 32 is, for example, connected to the first polarization maintaining fiber 31 by melt bonding. The second polarization maintaining fiber 32 may also be connected to the first polarization maintaining fiber 31 through an adhesive or other connection method besides melt bonding. As described in Japanese Unexamined Patent Publication No. 2020-126006, the second polarization maintaining fiber 32 has a length of one-quarter the beat length and thereby functions as a ¼ wavelength plate.

The GI fiber 33 is an optical fiber which has a radial distribution of the refractive index of the core and transmits light introduced from the second polarization maintaining fiber 32 to the core by a sine wave having a period of a pitch P. One end of the GI fiber 33 is optically connected through the second polarization maintaining fiber 32 to the first polarization maintaining fiber 31. The cladding diameter of the GI fiber 33 is the same as the cladding diameters of the first polarization maintaining fiber 31 and the second polarization maintaining fiber 32.

The GI fiber 33 has a length of one-quarter of the pitch P so outputs the light introduced from the second polarization maintaining fiber 32 to the magnetic film 34 as collimated light. Further, the collimated light introduced from the magnetic film 34 is output to the core of the second polarization maintaining fiber 32.

Figure 3B:
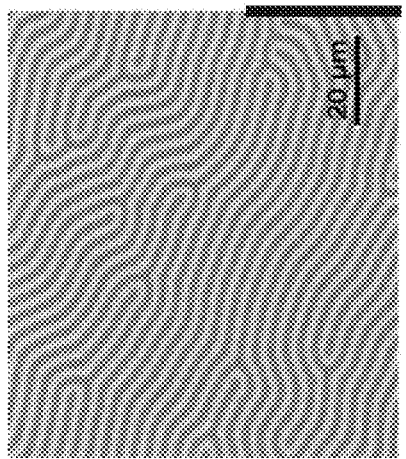
FIG. 3B is a plane photograph of the magnetic film.
Figure 3C:
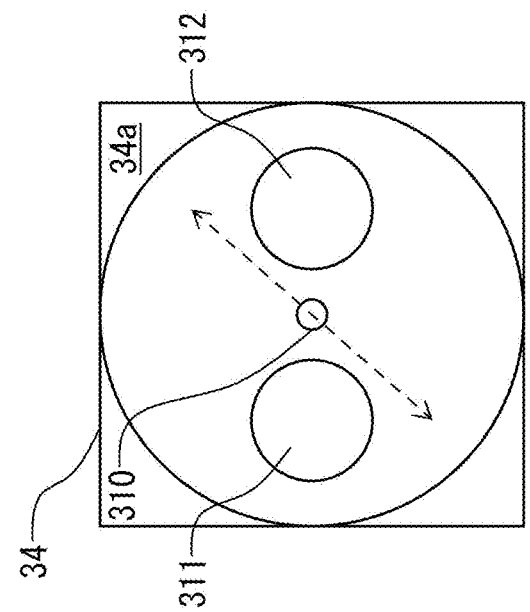
FIG. 3C is a view showing the positional relationship between the first polarization maintaining fiber and magnetic film.
Figure 3A:
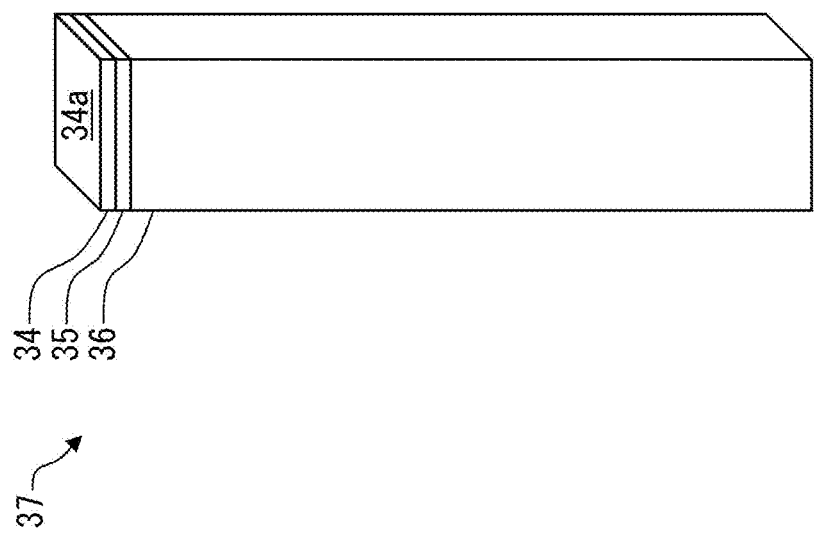
FIG. 3A is a perspective view of a rod-shaped member formed by the magnetic film, reflection film and support member.

FIG. 3A is a perspective view of a rod-shaped member 37 formed by the magnetic film 34, reflection film 35 and support member 36, FIG. 3B is a plane photograph of the magnetic film 34, and FIG. 3C is a view showing the positional relationship between the first polarization maintaining fiber 31 and magnetic film 34.

The surface 34a of the magnetic film 34 has a square-shaped planar shape, and the magnetic film 34 is joined to the other end of the GI fiber 33 by being adhered to the other end of the GI fiber 33 by a not shown adhesive material. The surface of the magnetic film 34 opposite to the surface joined to the GI fiber 33 is joined to one surface of the reflection film 35. The surface of the reflection film 35 opposite to the surface joined to the magnetic film 34 is joined to one end surface of the support member 36.

The magnetic film 34, reflection film 35 and support member 36 form a square columnar rod-shaped member 37 having bottom surfaces, one of the bottom surfaces is a surface 34a of the magnetic film 34, and the other of the bottom surfaces is the surface 35a opposite to the surface of the support member 36 joined to the reflection film 35. The surface 34a of the magnetic film 34 has a square-shaped planar shape, so the shape of the bottom surface of the rod-shaped member 37 formed by the magnetic film 34, reflection film 35 and support member 36 is a square shape.

The length of one side of the surface 34a of the magnetic film 34 is 125 μm, and is the same as the cladding diameter of the GI fiber 33. The magnetic film 34 is arranged so that the center of the surface 34a matches with the center of the GI fiber 33. Since the length of one side of the surface 34a of the magnetic film 34 is the same as the cladding diameter of the GI fiber 33 and the center of the surface 34a matches with the center of the GI fiber 33, the magnetic film 34 is arranged so that the outer rim of the GI fiber 33 is inscribed at the centers of the sides of the surface 34a.

The magnetic film 34 is a single crystal having a garnet type crystalline structure expressed by the formula $RxY_3$-$xFe_5O_{12}$ with a rare earth iron garnet replaced by a rare earth metal element, and is a Faraday rotator changing the phase of circularly polarized light emitted from the GI fiber 33 in accordance with the magnetic field in which the magnetic field sensor element is arranged. "R" is a rare earth metal which may be substituted for "Y".

The rare earth element is one or more elements selected from the group comprising elements stable alone and forming garnet type crystal structures with Fe such as Y, La, Ce, Pr, Nd, Sm, Eu, Gd, Tb, Dy, Ho, Er, Tm, Yb and Lu. Typically, it is Y. Since a garnet single crystal in which this rare earth element is replaced by Bi or Ce has a particularly large Faraday effect, the garnet single crystal is preferably used as a Faraday device.

As shown in FIG. 3B, the magnetic film 34 is a stripe-shape magnetic domain having a width of 10 μm or so and a length of 100 μm or more. The first polarization maintaining fiber 31 and the second polarization maintaining fiber 32 have core diameters of 10 μm or so. If the incident light 101 is directly output from the core of the second polarization maintaining fiber 32 to the magnetic film 34, optical alignment by magnetization is liable to be unable to be suitably obtained. Suitable optical alignment may be obtained by broadening the luminous flux by the GI fiber 33 to 125 μm or so.

The reflection film 35 is a mirror element reflecting the light passed through the magnetic film 34 toward the magnetic film 34 to generate return light 102. The reflection film 35 outputs circularly polarized light opposite in direction of rotation to the circularly polarized light passed through the magnetic field sensor head 30 to the magnetic film 34. As the reflection film 35, for example, a silver (Ag) film, gold (Au) film, aluminum (Al) film, dielectric multilayer film mirror, etc. may be used. In particular, an Ag film with its high reflectance and an Au film with its high corrosion resistance are simple to form, so are preferable. The thickness of the reflection film 35 need only be a magnitude enabling a sufficient reflectance of 98% or more to be secured. In the case of an Ag film, 50 nm or more and 200 nm or less is preferable. The Faraday rotation angle may be increased, by using the reflection film 35 to make light bounce back and forth inside the magnetic film 34.

The support member 36 is a rectangular block-shaped member formed by glass with square-shaped end surfaces and forms the rod-shaped member 37 at one end together with the magnetic film 34 and the reflection film 35.

Figure 4:
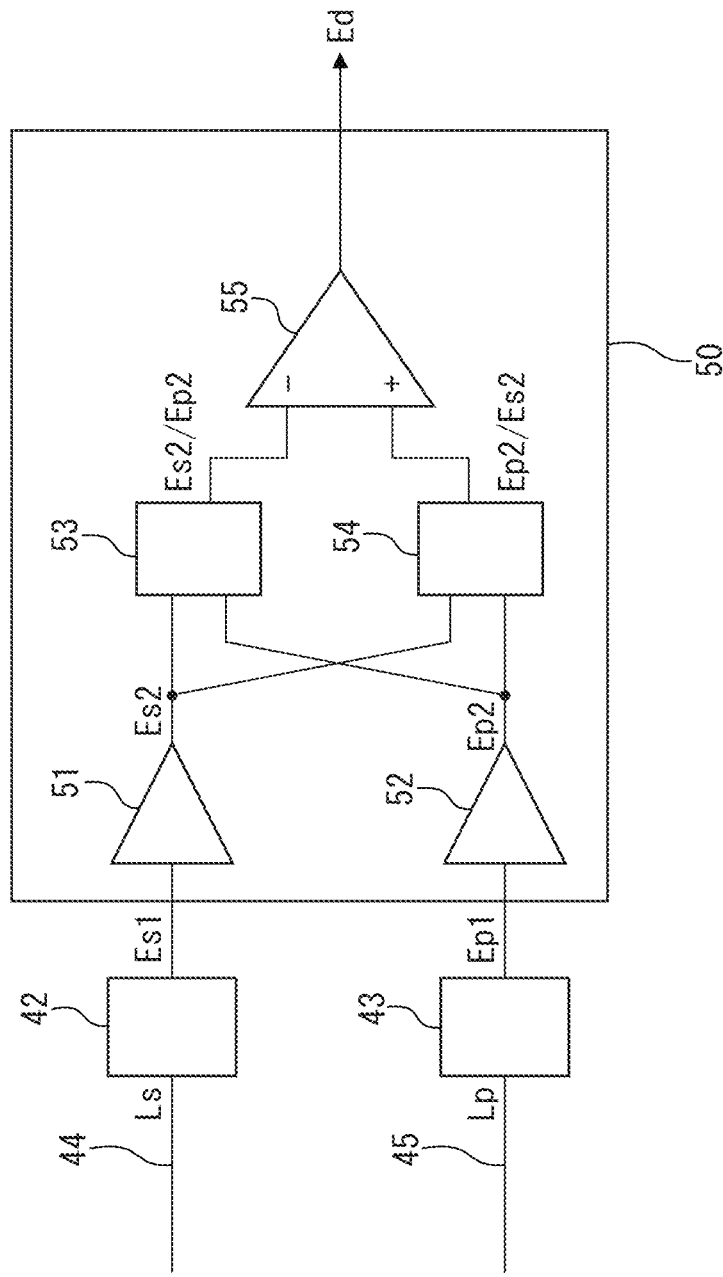
FIG. 4 is a block circuit diagram of a signal processor shown in FIG. 1.
Figure 5D:
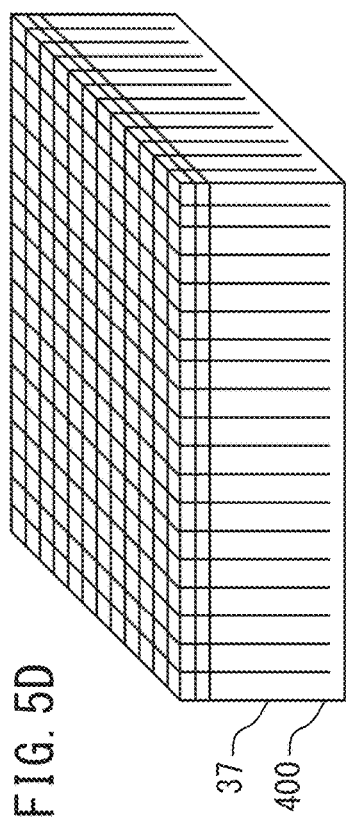
FIG. 5D shows a fourth step.
Figure 5E:
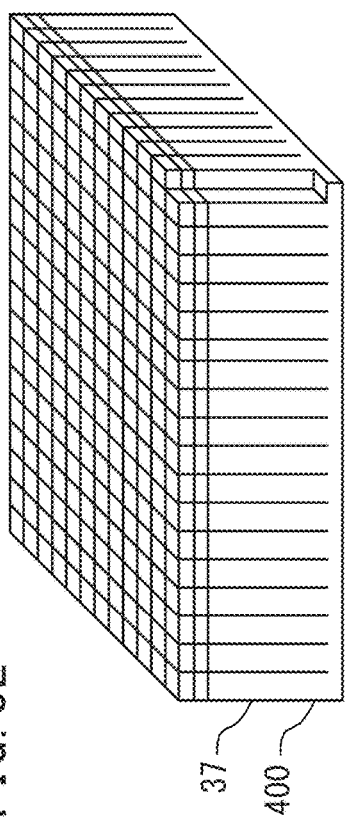
FIG. 5E shows a fifth step.
Figure 5A:
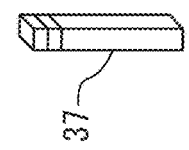
FIG. 5A shows a first step.
Figure 5A:
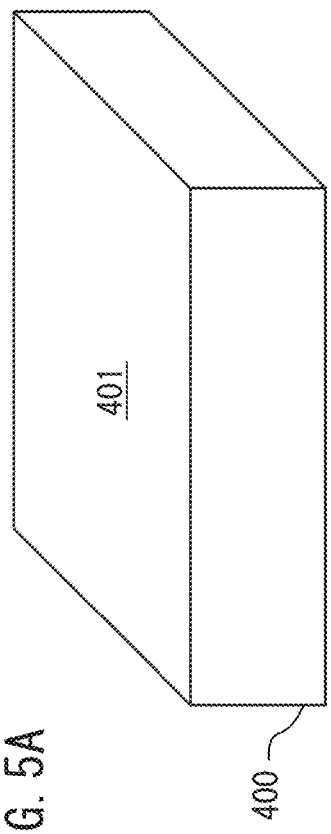
Figure 5B:
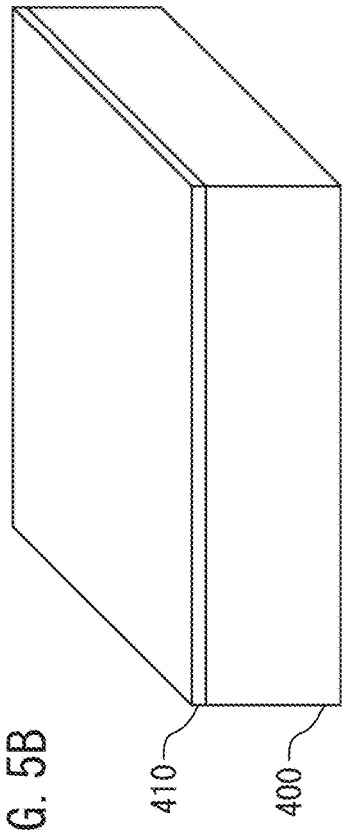
FIG. 5B shows a second step.
Figure 5C:
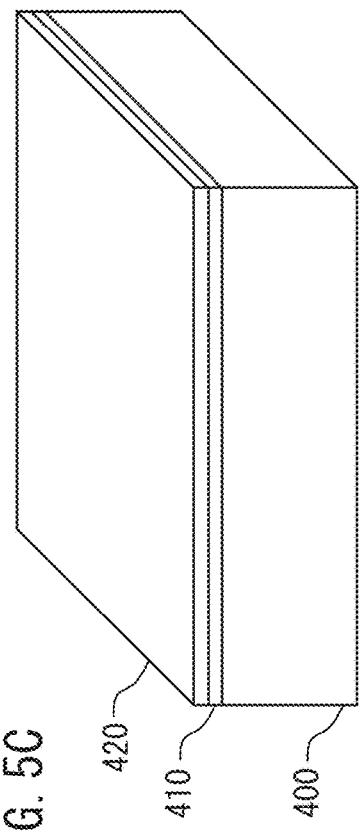
FIG. 5C shows a third step.

FIG. 4 is a block circuit diagram of a signal processor 50.

The signal processor 50 has a first amplification circuit 51, second amplification circuit 52, first division circuit 53, second division circuit 54 and differential amplification circuit 55. The signal processor 50 detects the difference of the intensities of the polarized light components from the electrical signals converted photoelectrically by the first light receiving element 42 and the second light receiving element 43 and replaces the detected numerical value with a current value.

The first amplification circuit 51 and the second amplification circuit 52 are respectively analog amplification circuits formed by operational amplifiers, resistance elements, etc.

The first amplification circuit 51 receives a first electrical signal Es1 corresponding to the luminescence Lp of the S-polarized light component 44 from the first light receiving element 42, and amplifies the input first electrical signal Es1 to output a first amplified electrical signal Es2. The second amplification circuit 52 receives a second electrical signal Ep1 corresponding to the luminescence Lp of the P-polarized light component 45 from the second light receiving element 43, and amplifies the input second electrical signal Ep1 to output a second amplified electrical signal Ep2.

The first division circuit 53 and the second division circuit 54 are respectively analog division circuits formed by operational amplifiers, resistance elements, etc.

The first division circuit 53 divides the first amplified electrical signal Es2 by the second amplified electrical signal Ep2 and outputs a first analog signal (Es2/Ep2) showing the divided output value to a minus input terminal of the differential amplification circuit 55. The second division circuit 54 divides the second amplified electrical signal Ep2 by the first amplified electrical signal Es2 and outputs a second analog signal (Ep2/Es2) showing the divided output value to the minus input terminal of the differential amplification circuit 55.

The differential amplification circuit 55 is, for example, an operational amplifier. It differentially amplifies the first analog signal (Es2/Ep2) input from the first division circuit 53 and the second analog signal (Ep2/Es2) input from the second division circuit 54 and outputs a detection signal Ed.

(Manufacturing Method Magnetic Field Sensor Head According to Embodiment)

FIG. 5 is a view showing a manufacturing method of the rod-shaped member 37 formed by the magnetic film 34, reflection film 35, and support member 36. FIG. 5A shows a first step, FIG. 5B shows a second step, FIG. 5C shows a third step, FIG. 5D shows a fourth step, and FIG. 5E shows a fifth step.

First, at the first step, a glass base member 400 is prepared for forming base members of a plurality of support members 36. The surface 401 of the glass base member 400 has sides with lengths of whole multiples of the end surfaces of the square-shaped support members 36. The glass base member 400 has a height longer than the lengths of the support members 36.

Next, at the second step, a reflection layer 410 forming the base members of the reflection films 35 is formed on the surface 401 of the glass base member 400. The reflection layer 410 is formed by vapor deposition of silver, gold, aluminum, or other reflection films 35 on the surface 401 of the glass base member 400.

Next, at the third step, a magnetic layer 420 forming the base members of the magnetic film 34 is formed on the surface 401 of the glass base members 400. The magnetic layer 420 is, for example, formed on the surface of the reflection layer 410 by the flux growth method, metal organic chemical gas phase growth method, sol-gel method, or other method of formation.

Next, at the fourth step, the base member 400 on which the reflection layer 410 and magnetic layer 420 have been formed is half diced into a lattice shape so that the magnetic layer has square-shaped planar shapes. The base member 400 has a depth the same as the lengths of the support members 36. When the base member 400 is half diced, rod-shaped members 37 are formed with bottom surfaces fastened by the base member 400 and with magnetic films 34 and the reflection films 35 formed on their surfaces.

Further, at the fifth step, the rod-shaped members 37 formed at the fourth step are cut from the base member 400, and the manufacturing of the rod-shaped members 37 is finished.

Figure 6A:
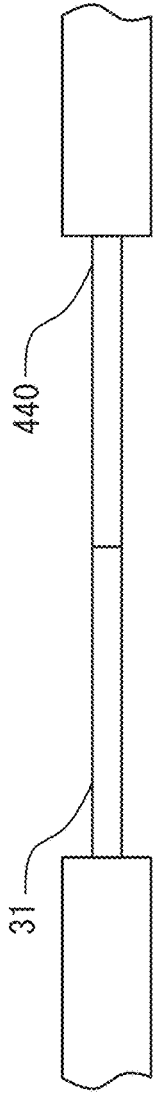
FIG. 6A shows a first step.
Figure 6B:
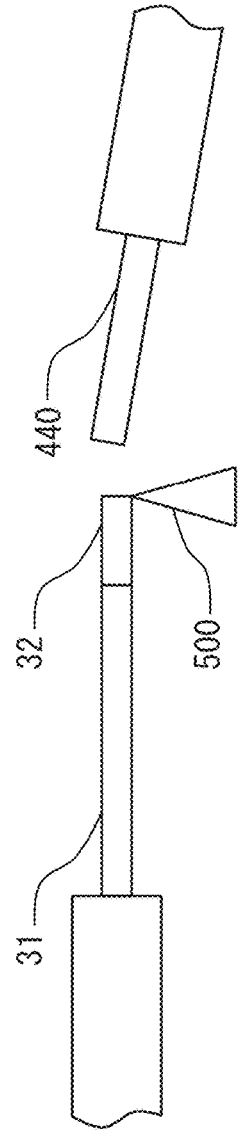
FIG. 6B shows a second step.
Figure 6C:
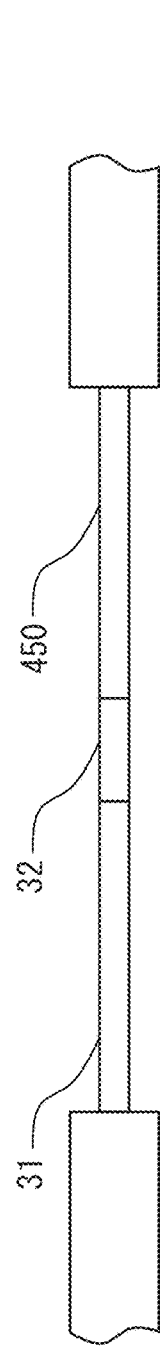
FIG. 6C shows a third step.
Figure 6D:
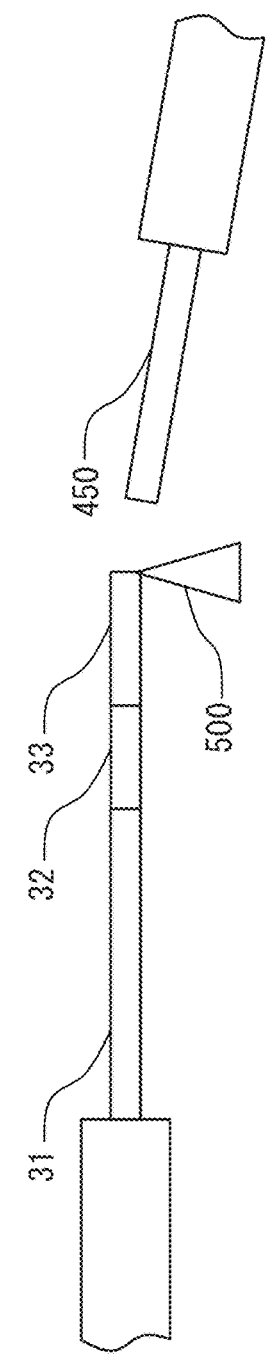
FIG. 6D shows a fourth step.
Figure 6E:
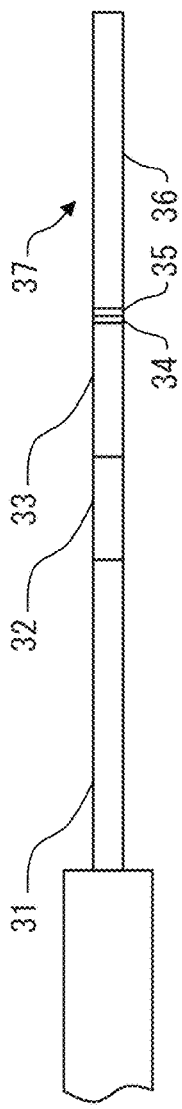
FIG. 6E shows a fifth step.

FIG. 6 is a view showing a manufacturing method of the magnetic field sensor head 30, wherein FIG. 6A shows a first step, FIG. 6B shows a second step, FIG. 6C shows a third step, FIG. 6D shows a fourth step, and FIG. 6E shows a fifth step.

First, at the first step, the base member 440 of the second polarization maintaining fiber 32 is melt bonded to an end of the first polarization maintaining fiber 31 so that their respective slow axes and fast axes are inclined 45 degrees. Next, at the second step, a fiber cleaver 500 is used to cut the base member 450 so that a distance from an end to be connected to the end of the first polarization maintaining fiber 31 becomes a length of one-quarter of the beat length to thereby form the second polarization maintaining fiber 32.

Next, at the third step, the base member 450 of the GI fiber 33 is melt bonded to the end of the second polarization maintaining fiber 32 cut by the fiber cleaver 500. Next, at the fourth step, the fiber cleaver 500 is used to cut the base member 450 so that a distance from an end to be connected to the end of the second polarization maintaining fiber 32 becomes a length of one-quarter of the pitch P to thereby form the GI fiber 33.

Further, the magnetic film 34 of the rod-shaped member 37 manufactured by the manufacturing method explained with reference to FIG. 5 is joined to the end of the GI fiber 33 cut by the fiber cleaver 500 by being adhered to it by an adhesive. The cladding diameter of the GI fiber 33 and the length of one side of the magnetic film 34 are the same, so when the surface of the magnetic film 34 is bonded to the GI fiber 33, it is self aligned so that the outer rim of the end surface of the GI fiber 33 contacts the centers of the side of the surface of the magnetic film 34.

(Effect of Magnetic Field Sensor Head According to Embodiment)

The magnetic field sensor head 30 may raise the detection sensitivity by the GI fiber 33 arranged between the second polarization maintaining fiber 32 and magnetic film 34 broadening the luminous flux of the incident light 101 output from the second polarization maintaining fiber 32.

Further, the magnetic field sensor head 30 employs as the element for broadening the luminous flux of the incident light 101 output from the second polarization maintaining fiber 32 a GI fiber 33 easy to optically align with the second polarization maintaining fiber 32, so may be easily manufactured.

Further, in the magnetic field sensor head 30, the cladding diameter of the GI fiber 33 is equal to the cladding diameter of the first polarization maintaining fiber 31 and the second polarization maintaining fiber 32, so optical alignment of the first polarization maintaining fiber 31 and the second polarization maintaining fiber 32 with the GI fiber 33 becomes further easier.

Further, in the magnetic field sensor head 30, the length of one side of the surface 34a of the magnetic film 34 is the same as the cladding diameter of the GI fiber 33, so when adhering the magnetic film 34 to the GI fiber 33 by an adhesive, the magnetic film 34 is self aligned, so optical alignment is easy.

Further, when manufacturing the magnetic field sensor head 30, the rod-shaped member 37 comprised of the support member 36 on which the reflection film 35 and magnetic film 34 are formed is adhered to the GI fiber 33 by an adhesive, so the GI fiber 33 and the magnetic film 34 may be easily bonded by gripping the support member 36.

(Modification of Magnetic Field Sensor Head According to Embodiment)

The magnetic field sensor head 30 has a second polarization maintaining fiber 32 functioning as a ¼ wavelength plate, however the magnetic field sensor head according to the embodiment need not have the second polarization maintaining fiber 32. When the magnetic field sensor head according to the embodiment does not have the second polarization maintaining fiber 32, the structure of the magnetic field sensor device including the magnetic field sensor head is suitably changed.

Further, in the magnetic field sensor head 30, the cladding diameter of the GI fiber 33 is the same as the cladding diameter of the second polarization maintaining fiber 32, however in the magnetic field sensor head according to the embodiment, the cladding diameter of the GI fiber may also differ from the cladding diameter of the optical fiber to be joined with.

Further, in the magnetic field sensor head 30, the length of the GI fiber 33 is one-quarter of the pitch P, however in the magnetic field sensor head according to the embodiment, the length of the GI fiber may also be three-quarters of the pitch P. Further, in the magnetic field sensor head according to the embodiment, the length of the GI fiber may also be a length of n×P×(1±¼) depending on the positive number "n" and the pitch P.

Further, in the magnetic field sensor head 30, the length of one side of the surface 34a of the magnetic film 34 is the same as the cladding diameter of the GI fiber 33, however in the magnetic field sensor head according to the embodiment, the length of one side of the surface of the magnetic film need only be equal to or more than 20 µm. Incident light 101 may be emitted at a stripe shaped magnetic domain in which light modulation may be suitably obtained, by making the length of one side of the surface of the magnetic film 20 µm or more.

Further, in the magnetic field sensor head 30, when the cladding diameter of the GI fiber is equal to or more that the length of the diagonal of the surface of the magnetic film, and is equal to or less the length of a side of the surface of the magnetic film, a self alignment effect may occur when bonding the GI fiber to the surface of the magnetic film.

Figure 7:
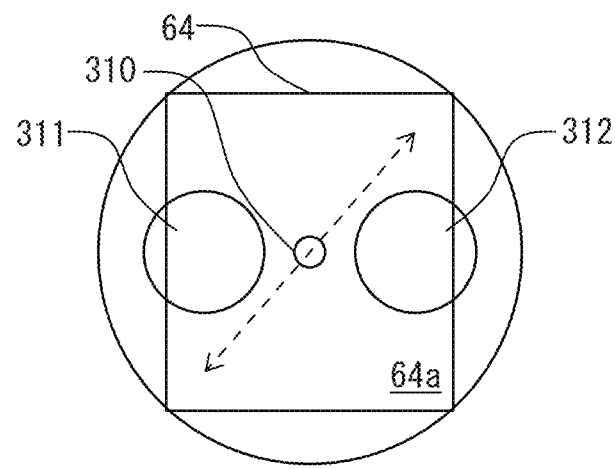
FIG. 7 is a view showing the positional relationship between the first polarization maintaining fiber and the magnetic film in a magnetic field sensor head according to a modification.

FIG. 7 is a view showing the positional relationship between the first polarization maintaining fiber and the magnetic film in a magnetic field sensor head according to a modification.

The magnetic field sensor head according to the modification shown in FIG. 7 differs from the magnetic field sensor head 30 in the areas of the magnetic film, reflection film and support member when viewing them planarly. The configurations and functions of the component elements of the magnetic field sensor head according to the modification aside from the areas of the magnetic film, reflection film and support member when viewing them planarly are the same as the configurations and functions of the component elements of the magnetic field sensor head 30, so detailed explanations will be omitted.

The magnetic film 64 has a square-shaped surface 64a with a length of a side of 88.4 µm. The length of a diagonal of the surface 64a matches with the cladding diameter of the GI fiber 33. The film is arranged so that its four corners are inscribed at the outer rim of the GI fiber.

In the magnetic field sensor head according to the modification, since the length of the diagonal of the surface 64a matches the cladding diameter of the GI fiber 33, when the surface of the magnetic film 64 is bonded to the GI fiber 33, the corners of the surface 64a are self aligned so that the outer rim of the end surface of the GI fiber 33 are contiguous with them. The length of a side of the bottom surface of the rod-shaped member may also be equal to or less than the cladding diameter of the GI fiber.

Further, in the magnetic field sensor head according to the embodiment, when the length of the diagonal of the surface of the magnetic film is the cladding diameter of the GI fiber or more and the length of a side of the surface of the magnetic film is the cladding diameter of the GI fiber or less, the magnetic film is bonded to the GI fiber by self alignment, so optical alignment is easy.

Figure 8:
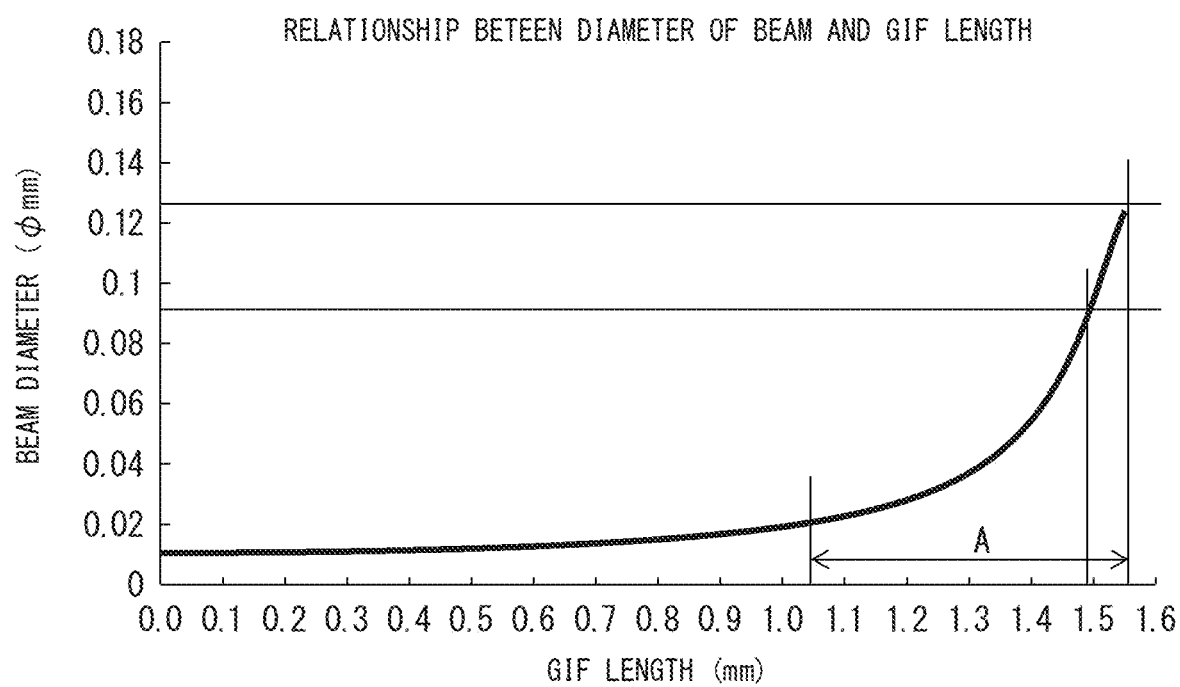
FIG. 8 is a view for explaining one example of the preferable length of the GI fiber.

FIG. 8 is a view for explaining one example of the preferable length of the GI fiber 33. In the example shown in FIG. 8, the wavelength of the incident light 101 is 1550 nm, the cladding diameter is 125 µm, NA is 0.1 and A is 1.0.

In the example shown in FIG. 8, the length of the GI fiber 33 when the beam diameter of the incident light 101 which is introduced from the GI fiber 33 to the reflection film matches the cladding diameter of the GI fiber 33 is 1.55 mm. By making the length of the GI fiber 33 used in the magnetic field sensor head 30 according to the present disclosure 1.55 mm, light may be introduced over the entire surface of the magnetic film 34.

Further, the length of the GI fiber 33 when the beam diameter of the incident light 101 introduced from the GI fiber 33 to the reflection film is 20 µm is 1.03 mm. By making the length of the GI fiber used in the magnetic field sensor head according to the embodiment 1.03 mm, when the length of one side of the magnetic film is 20 µm, light may be introduced over the entire surface of the magnetic film.

Further, the length of the GI fiber 33 when the beam diameter of the incident light 101 introduced from the GI fiber 33 to the reflection film is 88.4 mm is 1.49 mm. By making the length of the GI fiber used in the magnetic field sensor head according to the embodiment 1.49 mm, light may be introduced over the entire surface of the magnetic film when the length of one side of the magnetic film is 88.4 µm and the length of the diagonal of the magnetic film matches the cladding diameter of the GI fiber 33.

In the magnetic field sensor head according to the embodiment, the length of the GI fiber 33 is preferably made the 1.03 mm or more and 1.55 mm or less shown by the two-directional arrow mark A in FIG. 8. In the magnetic field sensor head according to the embodiment, by making the length of the GI fiber 33 1.03 mm or more and 1.55 mm or less, the beam diameter of the incident light 101 introduced from the GI fiber 33 to the reflection film may is equal to or more than 20 µm, and is equal to or less than the length of a side of the reflection film.

What is claimed is:

1. A magnetic field sensor head comprising:
   an optical fiber;
   a GI fiber whose one end is optically connected to the optical fiber;
   a magnetic film joined to the other end of the GI fiber;
   a reflection film joined to a surface of the magnetic film opposite to a surface joined to the magnetic film; and
   a support member joined to a surface of the reflection film opposite to the surface joined to the magnetic film, and forming a rod-shaped member at one end together with the magnetic film and the reflection film.

2. The magnetic field sensor head according to claim 1, wherein
   the cladding diameter of the GI fiber is the same as the cladding diameter of the optical fiber.

3. The magnetic field sensor head according to claim 2, wherein
   the rod-shaped member has a square columnar rod-shaped member having square-shaped bottom surfaces, one of the bottom surfaces is the surface of the magnetic film joined to the GI fiber, and the other of the bottom surfaces is a surface opposite to the surface of the support member joined to the reflection film.

4. The magnetic field sensor head according to claim 3, wherein
the magnetic film is a rare earth iron garnet.

5. The magnetic field sensor head according to claim 4, wherein
the length of one side of the surface of the magnetic film is equal to or more than 20 μm, and is equal to or less than the cladding diameter of the GI fiber.

6. The magnetic field sensor head according to claim 5, wherein
the length of the diagonal of the surface of the magnetic film is equal to or less than the cladding diameter of the GI fiber.

7. The magnetic field sensor head according to claim 5, wherein
the beam diameter of light introduced from the GI fiber to the reflection film is equal to or more than 20 μm, and is equal to or less than the length of one side of the reflection film.

8. A manufacturing method of a magnetic field sensor head comprising:
melt bonding one end of an optical fiber to one end of a GI fiber; and
adhering a square-shaped bottom surface of a square columnar rod-shaped member having a support member on which a reflection film and magnetic film are formed, by adherence to the other end of the GI fiber, wherein
the length of one side of the bottom surface of the magnetic film is equal to or more than 20 μm, and is equal to or less than the cladding diameter of the GI fiber.

9. The manufacturing method according to claim 8, wherein
the length of one side of the surface of the magnetic film is equal to or less than the cladding diameter of the GI fiber.

10. The manufacturing method according to claim 9, further comprising:
forming a reflection layer on a base member;
forming a magnetic layer on the magnetic reflection layer;
forming the rod-shaped member with one end of the rod-shaped member bonded to the base member by half dicing the base member on which the reflection layer and magnetic layer are formed so that the magnetic layer has a square-shape; and
cutting the rod-shaped member from the base member.

* * * * *